(12) United States Patent
Aitani et al.

(10) Patent No.: US 6,192,898 B1
(45) Date of Patent: Feb. 27, 2001

(54) METHOD AND APPARATUS FOR CLEANING A CHAMBER

(75) Inventors: Terukazu Aitani, Chiba; Takaaki Yamamoto, Nabashino, both of (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/268,103

(22) Filed: Mar. 13, 1999

Related U.S. Application Data

(62) Division of application No. 08/682,861, filed on Jul. 12, 1996, now Pat. No. 5,902,403.

(30) Foreign Application Priority Data

Nov. 28, 1995 (JP) ........................................................ 7-30903

(51) Int. Cl.$^7$ ................................. B08B 7/00; B08B 7/04
(52) U.S. Cl. ................................................. 134/1.1; 134/18
(58) Field of Search ................................. 134/18, 1.1, 1.2; 156/345; 118/723 E, 723 R

(56) References Cited

U.S. PATENT DOCUMENTS

| | | | |
|---|---|---|---|
| 5,311,452 | 5/1994 | Yokota et al. | 364/571.05 |
| 5,423,936 | 6/1995 | Tomita et al. | 156/345 |
| 5,914,051 | * 6/1999 | Kanai et al. | 156/345 X |

FOREIGN PATENT DOCUMENTS

| | | |
|---|---|---|
| 58-140126 | * 8/1983 | (JP) . |
| 6-224163 | 12/1994 | (JP) . |

* cited by examiner

*Primary Examiner*—Alexander Markoff
(74) *Attorney, Agent, or Firm*—Thomason, Moser & Patterson

(57) ABSTRACT

The present invention provides a method and apparatus for cleaning deposits in a chemical vapor deposition ("CVD") chamber equipped for generating a plasma A gas supplying line is connected to the CVD chamber to deliver a cleaning gas that reacts with the deposits formed therein. When all of the deposits have been reacted and the chamber is clean, the pressure in the chamber will change, either increasing or decreasing. A pressure detector located beyond an adjustable valve in the exhaust line allows the reaction end point to be determined, while allowing the adjustable valve to maintain a constant pressure in the chamber itself.

6 Claims, 5 Drawing Sheets

METHOD AND APPARATUS FOR CLEANING A CHAMBER

This is a divisional of application Ser. No. 08/682,861 filed Jul. 12, 1996, now U.S. Pat. No. 5,902,403.

BACKGROUND OF THE INVENTION

1. Field of the Invention

The present invention relates to a method and apparatus for cleaning a vacuum chamber used in fabricating integrated circuits, such as a chemical vapor deposition (CVD) chamber or physical vapor deposition (PVD) chamber.

2. Background of the Prior Art

In a typical CVD process adopted for manufacturing semiconductor devices, chemical reactions for depositing a desired material takes place in an enclosed processing chamber. The substrate receiving the material is typically supported on a susceptor or other substrate support member located inside the processing chamber. While the material is being deposited on the substrate, the material may also deposit as a film on the wall of the processing chamber. A residue of the material builds up corresponding to the number of substrates processed in the chamber, leading perhaps to an unstable process and typically to the generation of contaminants or particles in the chamber. Consequently, it is necessary to clean the interior of the processing chamber on a regular basis, for example by plasma discharge.

When the chamber cleaning operation is performed, the production of semiconductor devices can not continue. As a result, the effective productivity of the chamber, as measured by substrate throughput, decreases significantly. In order to increase the chamber productivity, it is necessary to quickly finish the cleaning operation and restart the production promptly after the end of the cleaning operation. Conventional plasma cleaning operations are complete, or reach an end point, when the residue is fully eliminated from the chamber as indicated by monitoring a variation in a prescribed light wavelength emitted by the plasma. However, it is difficult to correctly detect the end point of the cleaning operation using this method, because light emitted from lamps used to heat the substrate also heats, reacts with or otherwise affects the wavelength monitor.

Japanese Kokai Patent Application No. Hei 6[1994]-224163 ("the '163 patent") discloses a process that attempts to solve this problem by detecting the end point of the cleaning operation using a mass spectrometer, or by monitoring the chamber pressure using a pressure meter. According to the method disclosed, the pressure variations within the chamber during the self-cleaning operation are measured directly. For example, when a pressure meter is used, the variation in the pressure in the vacuum chamber caused by generation of the reaction product is measured using a dial gauge to detect the end point of the self-cleaning operation.

However, when a mass spectrometer is used in accordance with the '163 patent, the system for detecting the end point of the cleaning operation becomes too large for practical use in a manufacturing process. Furthermore, when the pressure measurement is performed in the vacuum chamber according to the '163 patent, only the pressure drop inside the vacuum chamber is measured. This method of detecting the end point of a cleaning reaction is impractical and can easily provide false endpoints due to normal fluctuations in the chamber pressure.

Therefore, there is a need for a device and method for practical use in semiconductor manufacturing processes that can detect the end point of a process chamber cleaning operation without the problems described above.

SUMMARY OF THE INVENTION

The present invention provides a method and apparatus for determining the endpoint of a chemical reaction in real time in a processing environment. Specifically, the present invention provides a method and apparatus for determining the endpoint of a cleaning process in a processing chamber by detecting a pressure change using a pressure detector positioned in an exhaust line downstream from the processing chamber. An advantage of detecting the endpoint using a pressure detector located outside of the chamber is that the endpoint detector is not subjected to the processing environment and will not be adversely affected by the sensitivities of the chamber or the real time regulation of the processing environment.

In one aspect of the invention, a self-cleaning chemical vapor deposition device is described and comprises a pressure-adjustable processing chamber having a pair of electrodes for generating a plasma therebetween; a source of electric power that is electrically connected to the electrodes; a cleaning gas supply line connected to the chamber, wherein the cleaning gas reacts with deposits in the chamber; an exhaust line having a first end connected to the processing chamber, a second end connected to an exhaust means, and an adjustable valve located between the first and second ends for controlling the pressure in the processing chamber, a first pressure detector connected to the exhaust line in a position between the exhaust means and the adjustable valve; and a controller that monitors the pressure detected by the first pressure detector to determine the end point of the cleaning gas reaction.

In another aspect of the invention, a method of cleaning deposits in a chemical vapor deposition chamber is provided comprising the steps of supplying a cleaning gas to the chamber; forming a plasma within the chamber; reacting the cleaning gas with deposits within the chamber until the deposits are consumed; exhausting gases from the chamber through an exhaust line communicating with an exhaust means; controlling an adjustable valve in the exhaust line to maintain a setpoint pressure within the chamber, detecting the pressure in the exhaust line between the adjustable valve and the exhaust means; and determining the end point of the reaction according to a change in the exhaust line pressure.

In still another aspect of the invention, a reaction chamber is provided comprising an enclosure for containing a solid or liquid material, the enclosure having a first pressure detector for detecting the pressure therein; a gas supply in communication with the enclosure for reacting with the material; and an exhaust line extending from the chamber and having an exhaust valve and a second pressure detector positioned in the exhaust line downstream from the exhaust valve, wherein the exhaust valve receives a signal from the first pressure detector and is controlled to maintain a substantially constant pressure in the enclosure.

In still another aspect of the invention, a method for determining the endpoint of a reaction between a first material in a processing chamber and a continuous flow of gas passing through the chamber to an exhaust line having an exhaust valve is provided, comprising the steps of detecting an operating pressure within the chamber; operating the exhaust valve to maintain the operating pressure; and detecting a pressure change in the exhaust line between the exhaust valve and the exhaust means to determine the endpoint of the reaction.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DESCRIPTION OF A PREFERRED EMBODIMENT

The present invention provides a chemical vapor deposition ("CVD") device having a pressure-adjustable CVD processing chamber with a pair of electrodes disposed in the chamber. The electrodes are electrically connected to an electric power source for generating a plasma between the electrodes for various purposes, including cleaning of the chamber. A gas supply line is connected to the CVD chamber to deliver a cleaning gas thereto. An exhaust line connects the chamber to an exhaust means and has an adjustable valve therein to control the pressure in the aforementioned CVD processing chamber. The pressure in the exhaust line is measured by a first pressure detector and the pressure inside the chamber is measured by a second pressure detector. The exhaust line pressure measurement is transmitted to a controller that monitors the variation in the chamber pressure to determine the end point of the cleaning operation. The chamber pressure measurement is transmitted to the controller which controls and corrects the pressure inside the chamber.

The present invention also includes a method of cleaning a CVD device having a CVD processing chamber with a pair of electrodes therein, an exhaust line communicating the CVD processing chamber to an exhaust means, and an adjustable valve in the exhaust line for adjusting the pressure in the chamber. Electrical power is applied between the electrodes to generate a plasma to clean the interior of the CVD processing chamber. The cleaning method comprises the steps of: (1) applying electrical power to the electrodes within the chamber, (2) feeding a cleaning gas into the chamber to start the cleaning operation, (3) detecting the pressure in an exhaust line connected to the chamber, (4) monitoring the variation in the exhaust line pressure with a controller, and (5) determining the end point of the cleaning operation. Using the controller to monitor the exhaust line pressure, it is possible to detect a prescribed pressure variation inside the chamber that takes place at the end point of the cleaning operation. The controller may also monitor and control the chamber pressure as indicated by the pressure detector located within the chamber so that normal variations in chamber pressure can be correctly detected and controlled without influencing the pressure in the exhaust line.

In one aspect of the present invention, the supply of electric power to the electrodes is stopped immediately after detection of the end point of the cleaning operation to minimize the loss in time due to the cleaning operation. In another aspect of the invention, the preferred cleaning gas comprises a fluorine-containing gas such that the prescribed pressure variation is a rise in the pressure. The invention will be explained in more detail below with reference to FIGS. 1–5. In the Figures, the same symbols are used to represent the same elements, so a repeated explanation is omitted.

Figure 1:
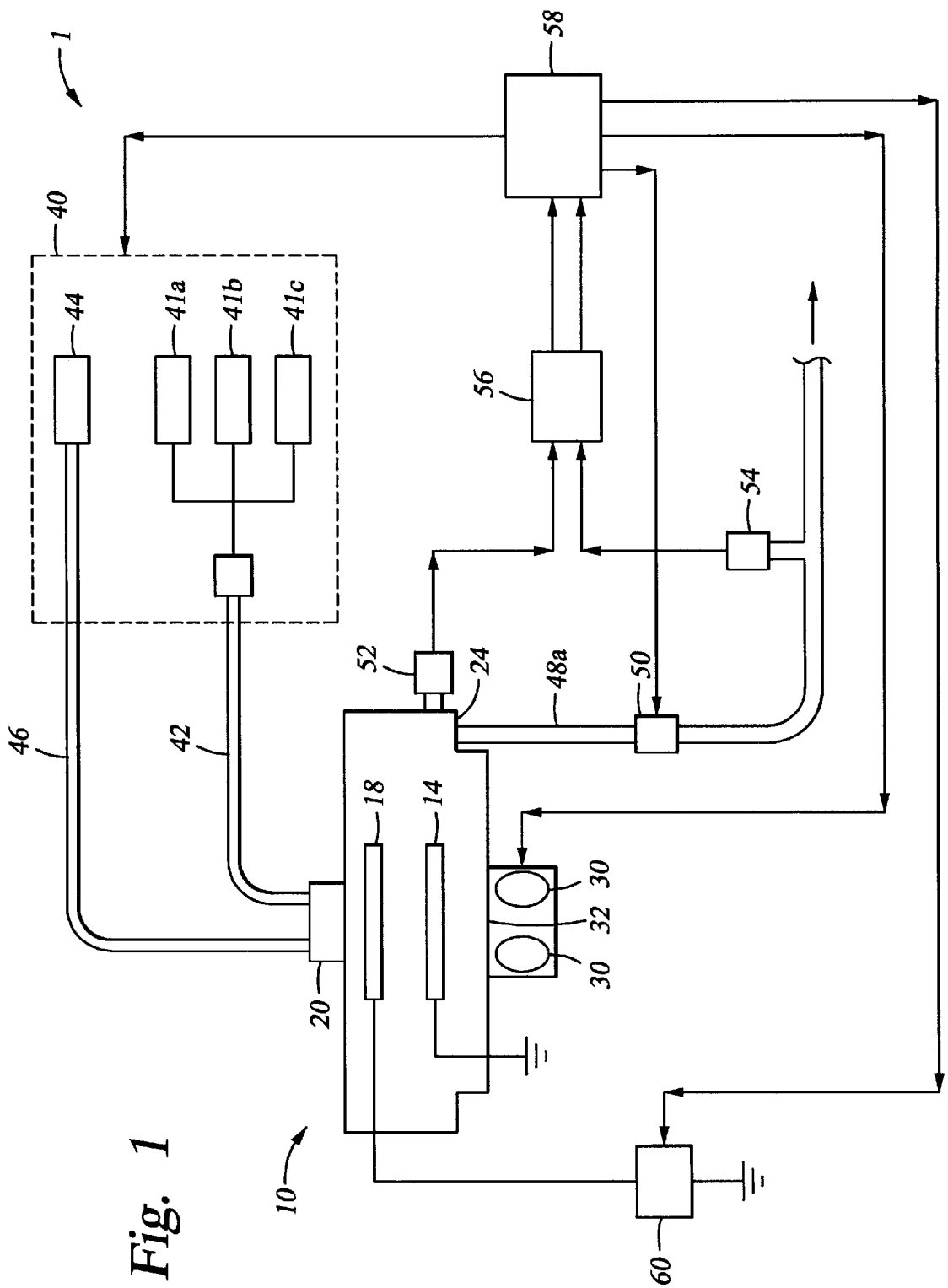
FIG. 1 is a diagram illustrating the configuration of the CVD device in this invention.
Figure 2:
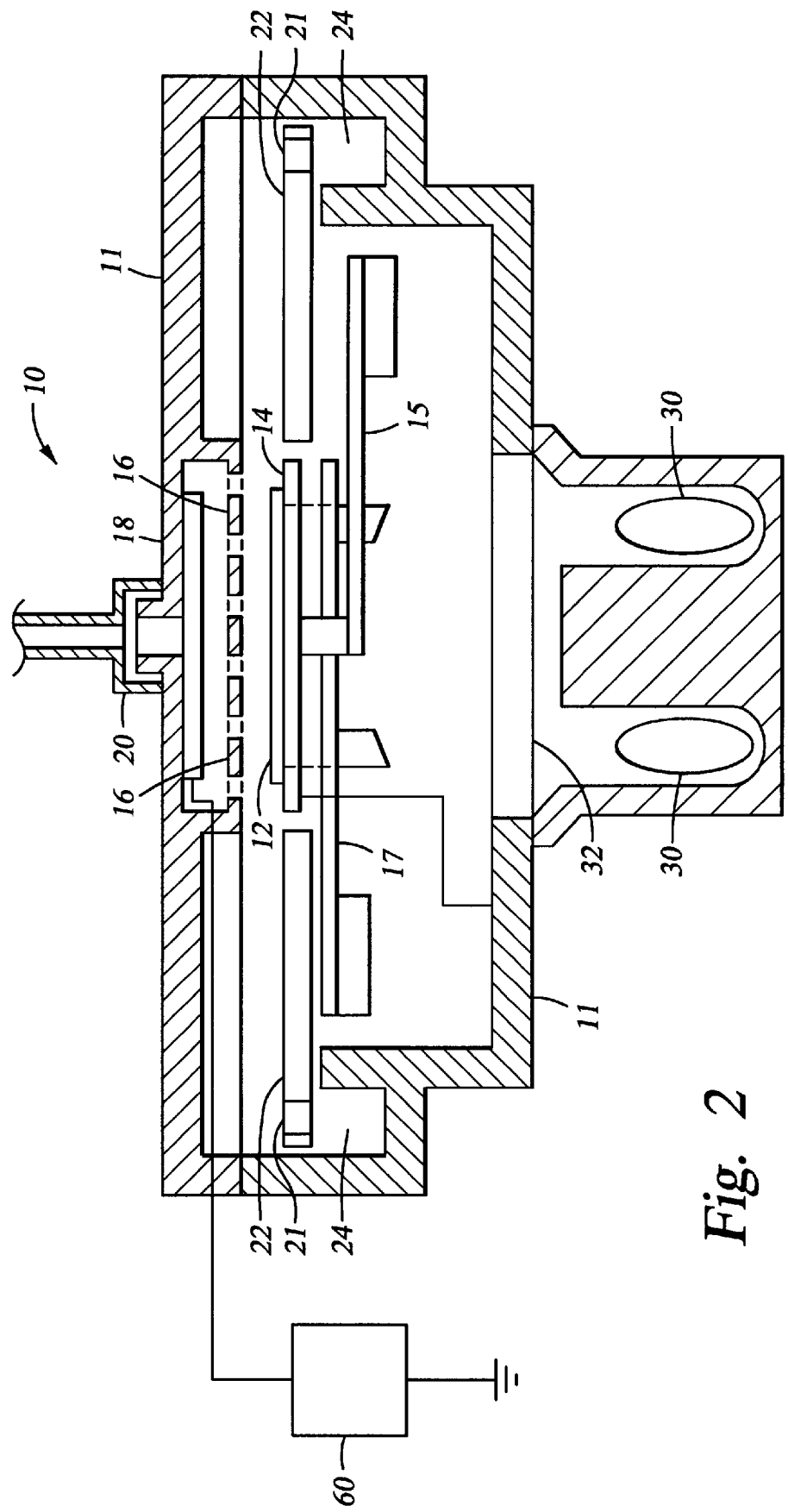
FIG. 2 is a cross-sectional view of the CVD processing chamber shown in FIG. 1.

FIG. 1 is a diagram illustrating one embodiment of the CVD device of this invention. FIG. 2 is a cross-sectional view of processing chamber (10) of the CVD device shown in FIG. 1. As shown in FIG. 1, CVD device (1) has a vacuum processing chamber (10) for performing a CVD process. In processing chamber (10), two process gas supply lines (42) and (46), which supply the process gas and carrier gas for CVD deposition from gas source unit (40), having flow-rate-adjustable gas sources (41a)–(41c) and (44), to chamber (10), are connected to gas inlet port (20) of chamber (10). In gas source (40), there is a cleaning gas source for supplying the gas for the cleaning operation. For deposition and cleaning, it is necessary to supply both the fluorine-type gas (i.e., $NF_3$, $CF_4$, and $C_2F_6$) and silane-type gas (i.e., $Si_nH_{2n+2}$) into the processing chamber. Consequently, for safety, it is necessary to feed them through different gas lines. Consequently, there are two gas lines.

To exhaust the spent gases out of the processing chamber (10), one end of an exhaust line (48) is connected to exhaust port (24) of chamber (10). The other end of exhaust line (48) is connected to a vacuum pump (not shown in the figure). On exhaust line (48), there is a throttle valve (50) for adjusting the exhaust flow rate. In the following description, in order to facilitate the explanation, exhaust line (48) is divided into an upstream portion (48a) and a downstream portion (48b) with respect to throttle valve (50), respectfully.

Also, there is a heating lamp (30) and plasma-generating electrodes (14) and (18) disposed in processing chamber (10). Electrodes (14) and (18) are connected to a radio frequency ("rf") power source (60) providing sufficient electrical potential to strike a plasma in the chamber (10). A quartz window (32) (see FIG. 2) is arranged between lamp (30) and the processing chamber to separate chamber (10) and lamp (30), yet allow light emitted by lamp (30) to effectively pass therethrough into processing chamber (10) to heat the interior of processing chamber (10).

Also, as shown in FIG. 1, a pressure detector (52), preferably a capacitance manometer, for measuring the pressure inside the processing chamber, is connected through the wall of chamber (10) in fluid communication with the chamber. A second pressure detector (54), preferably a capacitance manometer, is connected on the downstream side (48b) of throttle valve (50) on the exhaust line to monitor the pressure in the exhaust line.

For both pressure detectors (52) and (54), the applied pressure is converted and output as dc voltage corresponding to the change in the measurement pressure. For example, it is possible to make use of the 127-model 1-torr absolute-pressure type of converter manufactured by MKS Japan Co., Ltd.

As shown in FIG. 1, the chamber pressure detector (52) and the exhaust line pressure detector (54) are electrically connected to system controller (58) through A/D port (56), which converts the analog signals to digital signals. Also, as shown in FIG. 1, lamp (30), gas source (40), throttle valve (50), and rf source (60) are electrically connected to system controller (58), from which information can be processed and the control signals sent.

As shown in FIG. 1, the device for detecting the end point of a cleaning operation comprises a pressure measurement unit (pressure detector (54)) arranged on the downstream side (48b) of the exhaust line (48), the A/D port (56) that converts the analog signals from the pressure detector (54) to digital signals, and system controller (58), which processes the signals from A/D port (56) and controls gas source (40), lamp (30), and the rf power source (60). Therefore, the system controller (58) may be programmed to detect the end point of the cleaning reaction by means of variation in optical characteristics, such as the wavelength of light emitted by the plasma, inside the chamber just as in the conventional scheme, and/or by measurement of the variation in pressure on the downstream side (48b) of the valve (50).

Referring now to FIG. 2, a cross section of chamber (10) is shown so that the interior of processing chamber (10) can be explained in more detail. Processing chamber (10) includes a circular plate-shaped susceptor (14) disposed in the lower portion of the chamber to support a substrate (12) inside chamber wall (11) which is typically made of metal. Susceptor (14) itself can move up and down, with the susceptor (14) being supported on susceptor assembly (15), which undergoes vertical movement. Also, susceptor (14) is electrically connected (not shown in the figure) to chamber wall (11) through susceptor assembly (15). Furthermore, there is a substrate lift assembly (17) below the susceptor (14) having a lift pin for carrying and lifting/lowering a substrate (12) carried on susceptor (14). Wafer lift assembly (17) has no mechanical contact with susceptor assembly (15), and moves independently of susceptor assembly (15). As substrate lift assembly (17) undergoes vertical movement, the lift pin of substrate lift assembly (17) lifts/lowers the substrate (12) onto the susceptor (14).

There is also a manifold (18) for supplying gas into chamber (10). Above manifold (18), a gas inlet port (20) connected to gas source (40) is formed. Manifold (18) is connected to rf source (60), and chamber wall (11) is grounded. Consequently, susceptor (14) and manifold (18) act as a pair of electrodes, and the space between manifold (18) and susceptor (14) becomes the region where the plasma is generated. Below gas inlet port (20) and manifold (18), a shower head type of distributor (16) is arranged for dispersing the gas supplied into chamber (10) so that the gas is evenly distributed over the entire surface of susceptor (14). A pumping plate (22) is arranged adjacent the outer edge of susceptor (14) to control the flow of exhaust gases and to ensure a uniform vacuum level and distribution of gases across the surface of the susceptor. Below pumping plate (22), there is a ring-shaped vacuum chamber (24) for degassing. An opening (21) is formed in pumping plate (22) for flow from processing chamber (10) to vacuum chamber (24). While only two openings (21) are shown in the figure, it is preferred that between about 4 and about 32 openings be formed in a ring configuration to ensure a uniform flow of gases out of the chamber. The exhaust port (not shown in FIG. 2) connected to exhaust line (48) is connected to vacuum chamber (24) and is preferably formed on the side of the chamber. Consequently, the flow of the exhaust gases is prone to be deflected in the direction of the exhaust port. However, by arranging the pumping plate appropriately, the flow of the exhaust can be controlled.

Still referring to FIGS. 1 and 2, a full understanding of the self-cleaning operation in CVD device (1) is facilitated by a discussion of the gas composition at the end point of the cleaning operation. For example, in the cleaning operation of tungsten (W),CVD, nitrogen trifluoride ($NF_3$) is supplied at a selected flow rate from processing gas line (42), and rf electric power is applied between electrodes (14) and (18), so that an $NF_3$ plasma is generated for cleaning. In this case, tungsten (W) deposits present within processing chamber (10) react with fluorine (F) to form tungsten hexafluoride ($WF_6$). As the reaction proceeds, the fluorine gas is consumed and the pressure in chamber (10) decreases. This reaction continues until all of the residual tungsten reacts with fluorine, and the cleaning operation comes to an end. However, because $NF_3$ is still being supplied at a prescribed flow rate and the plasma is maintained, a fluorine-surplus (high fluorine concentration) appears in processing chamber (10), and the pressure inside chamber (10) rises. That is, at the end point of the cleaning operation, the pressure inside processing chamber (10) rises. Consequently, by detecting the rise in pressure inside chamber (10), it is possible to detect the end point of the cleaning operation.

However, as discussed above, the pressure in the processing chamber is always controlled to the optimum value for stabilizing the plasma Adjustment of the pressure in processing chamber (10) is performed by opening/closing throttle valve (50). Control of the pressure in processing chamber (10) is specifically performed by first converting the analog dc signal corresponding to the internal pressure of chamber (10) output from pressure detector (52) to a digital signal by A/I port (56), and is then input to system controller (58). System controller (58) then controls the open/close state of throttle valve (50), and the pressure in chamber (10) is controlled at a constant pressure to stabilize the plasma throughout the cleaning operation. However, even though the variation of the pressure inside chamber (10) over time can be directly measured by pressure detector (52), if the open/close state of throttle (50) is controlled by system controller (58) and the pressure variation is offset at the same time, the end point cannot be correctly determined.

According to the CVD device (1) of the present invention, a second pressure detector (54), such as a capacitance manometer, for detecting the end point is arranged in the downstream portion (48b) of the exhaust line (48) with respect to throttle valve (50). As the chamber pressure measured by pressure detector (52) is controlled by means of throttle valve (50), the pressure variation that takes place on the upstream side of throttle valve (50) is corrected. On the other hand, the pressure measured by detector (54) on the downstream side of the throttle valve (50) receives no pressure correction. In this way, the variation in the pressure that takes place inside processing chamber (10) can be correctly detected by a corresponding pressure change at the downstream detector (54). Consequently, the end point of the cleaning operation can be correctly detected by monitoring the pressure in the exhaust line downstream from throttle valve (50).

When a fluorine-type gas is used as the cleaning gas, the chamber pressure will rise at the end point of the cleaning operation. This pressure rise occurs at the end point because the cleaning gas reaction is no longer causing a net molar consumption of gas. However, where the cleaning gas reaction typically causes a net molar production of gas, the end point of the reaction may be indicated by a drop in the chamber pressure. It is within the scope of the present invention that even when the end point is indicated by a pressure drop, the end point can be correctly determined by a pressure detector (54).

In CVD device (1) of this invention shown in FIG. 1, the pressure in processing chamber (10) is monitored by pressure detector (54) in downstream portion (48b) with respect to throttle valve (50), and the signal is sent through A/D port (56) to system controller (58). The variation in pressure that takes place in chamber (10) upon completion of the cleaning operation is detected by system controller (58) and determines the end point. As the cleaning operation is completed, the system controller prepares for the next round of the film-forming operation by controlling the lamp (30), gas source (40), throttle valve (50) and rf source (60) according to specified set points for temperature, gas flow rate, pressure, and applied voltage.

The present invention will be explained in more detail with reference to certain examples. In Example 1, a CVD device equipped with the cleaning unit of the present invention is used to detect the end point of the cleaning operation. For comparison, Comparative Operation 1 involves a CVD device in which a conventional optical detector is used and Comparative Operation 2 involves a CVD device where the end point is determined by. directly measuring the chamber pressure.

EXAMPLE 1
End Point Detection in the Exhaust Line

The device shown in FIGS. 1 and 2 was used to clean the interior of processing chamber (10) following a tungsten deposition process, and for detecting the end point of the cleaning operation. The cleaning process was carried out in accordance with the procedure listed in Table I. During the cleaning-operation sequence, the temperature inside the chamber was maintained at a constant level.

TABLE 1

Typical chamber-cleaning operation of the present invention for tungsten

| Step | Pressure (State of Throttle Valve) | Application of RF Electric Power | Purge Gas | NF$_3$ | Argon | N$_2$ | End of Each Step |
|---|---|---|---|---|---|---|---|
| Purge | Fully Open | Off | Flow | No | Flow | Flow | After a prescribed time |
| Exhaust | Fully Open | Off | No | No | No | No | After a prescribed time |
| Cleaning | Under Control | On | No | Flow | No | No | Detection of end point by exhaust line presure |
| Exhaust | Fully Open | Off | No | No | No | No | After a prescribed time |

First, as a cleaning pretreatment, the atmosphere in processing chamber (10) was completely evacuated by purging the chamber with Ar and N$_2$ gases. Without supplying gas, throttle valve (50) was then fully opened, and the purge was performed. NF$_3$ was then fed into chamber (10) for cleaning. With the chamber pressure under control, rf power was applied between electrodes (14) and (18) to generate a NF$_3$ plasma for cleaning. In this case, based on the chamber pressure detected by pressure detector (52), throttle valve (50) was controlled by system controller (58), so that the pressure inside the chamber was controlled.

The end point of the cleaning operation was determined by monitoring the pressure detector (54) in exhaust line (48b) downstream from throttle valve (50). The controller (58) was adapted to receive pressure information from the pressure detector (54) and determined the endpoint of the cleaning operation when the signal from pressure detector (54) crossed a prescribed level or setpoint After detection of the end point, the atmosphere in chamber (10) was evacuated, and the series of cleaning steps was complete.

Figure 3:
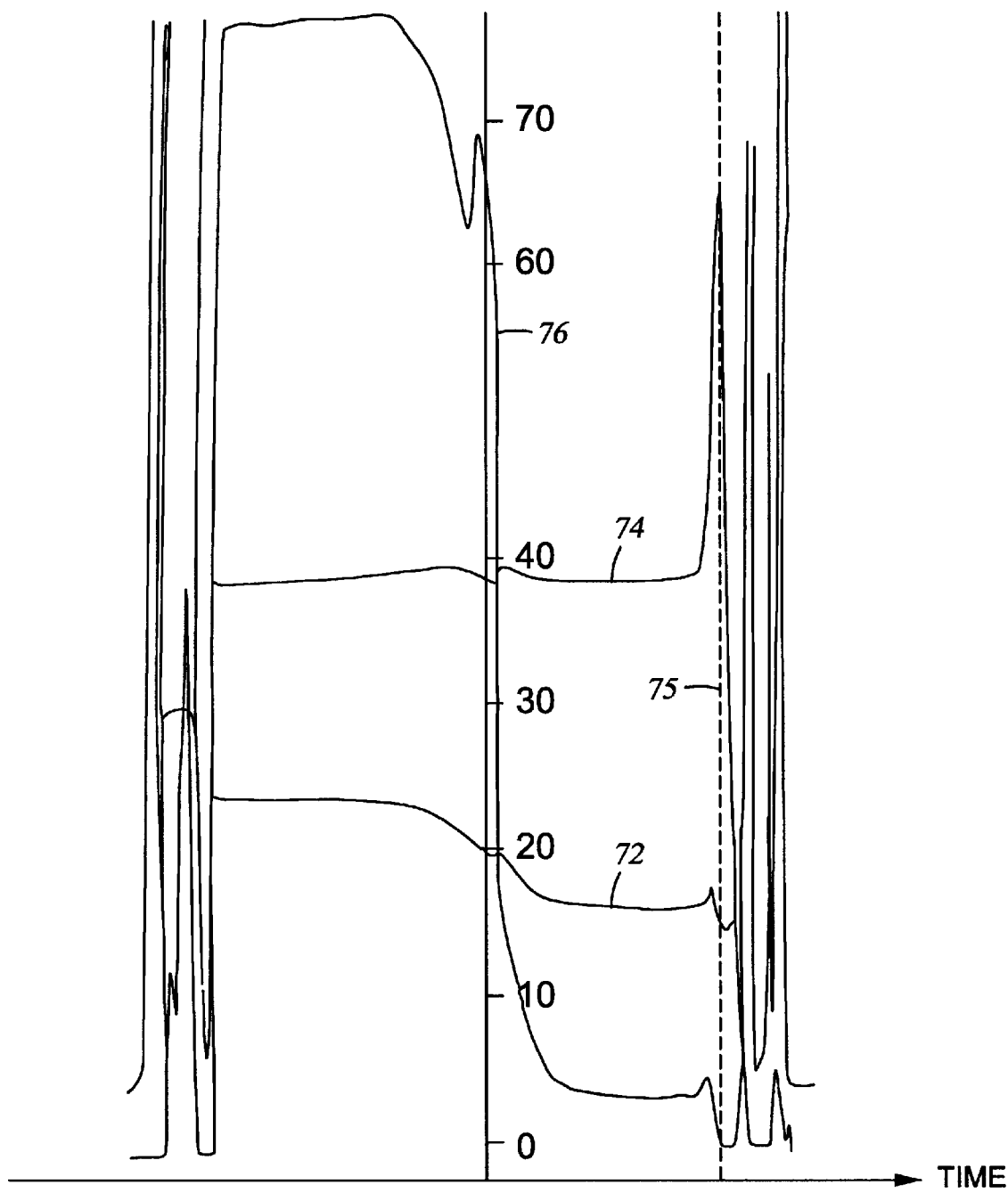
FIG. 3 is a chart showing the results of detection of the end point of the cleaning operation as it compares the application example of this invention with Comparative Examples 1 and 2 of the conventional technologies.
Figure 4A:
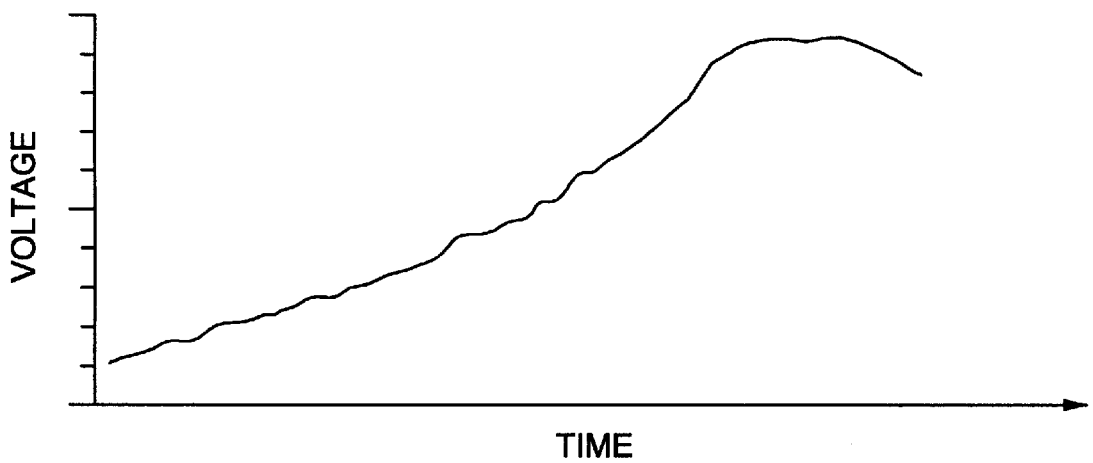
FIG. 4 is a graph illustrating the results of detection in the conventional optical detection method.
Figure 4B:
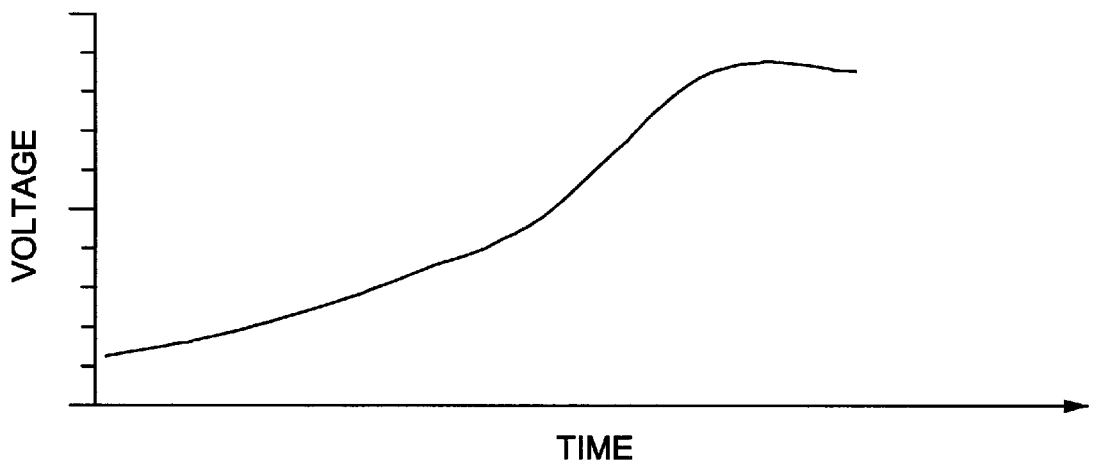

FIG. 3 is a diagram illustrating end point detection of the cleaning operation using a CVD device of the present invention. FIG. 3 compares the end point determined by the present invention with the end point determined by conventional technologies of Comparative Operations 1 and 2. Comparative Operation 1 provides optical detection of the end point by measurement of the variation in the wavelength of light when the residue was totally removed. Comparative Operation 2 provides a pressure meter to detect the end point of the cleaning process by directly measuring the chamber pressure.

In Comparative Operation 1, as can be seen from FIG. 4, it is clear that the optically detected end point is affected by the noise caused by the heating lamps. The conventional optical detection method is then compared with the detection method of this invention to determine whether both methods provide the same end point. In Comparative Operation 2, a comparison is made between the method of directly monitoring the chamber pressure and the method of monitoring of the pressure on the downstream side of the exhaust valve.

In Comparative Operation 1, an optical sensor was set in the chamber to measure the variation in the wavelength of light in the chamber. As pointed out above, the light emitted from heating lamp (30) leads to a response of the optical sensor. The variation in the wavelength detected contains a lot of noise making it difficult to correctly detect the end point. At this point, it is necessary to find out whether the end point detected by the end-point detecting method of the present invention is identical to that detected by the conventional optical detecting method. Therefore, a measurement was performed with the power source for heating lamp (30) turned off so that the noise was turned off for 150 seconds around the predicted end point of the cleaning operation. As a result, the variation in the wavelength free of noise was recorded in FIG. 4(b) for comparison with FIG. 4(a). However, the susceptor temperature fell 330° C. during this 150 second period making this procedure impractical for actual manufacturing operation. Consequently, this condition cannot be adopted for the actual cleaning operation for which a stable temperature is needed. Also, after the susceptor temperature falls, a long period of time is needed to heat the susceptor to the processing temperature for the next deposition operation and to stabilize the temperature.

As can be seen from FIG. 3, the results obtained by monitoring the variation in the pressure in the processing chamber on the exhaust line (shown by line 72) are identical to those using the conventional optical end-point detecting method (shown by line 74) in that the present invention and Comparative Operation 1 determined the end points of cleaning at the same time point as indicated by the dashed line (75).

Figure 5:
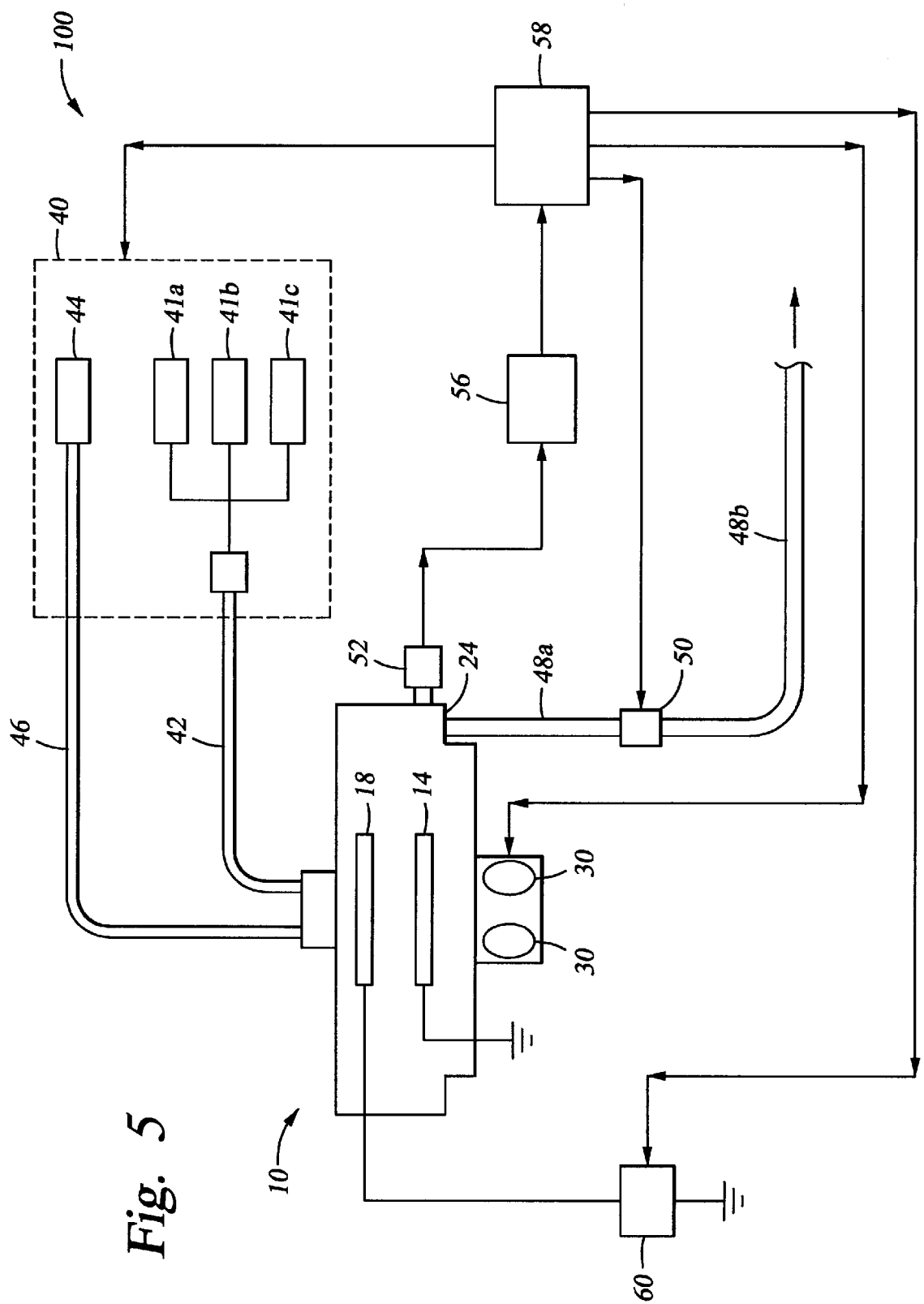
FIG. 5 is a diagram illustrating the configuration of a CVD device having a unit for detecting the end point of cleaning by detecting the pressure in the CVD processing chamber using the conventional technology.

In Comparative Operation 2, the pressure in the chamber was directly monitored, and the variation in the pressure in the chamber (shown by line 76) was used to determine the end point of the cleaning operation. FIG. 5 is a diagram illustrating the configuration of conventional CVD device (100) for direct detection of the pressure in the chamber. CVD device (100) used in Comparative Operation 2, as shown in FIG. 5, differs from CVD device (1) of this invention, as shown in FIG. 1, in that the conventional CVD device (100) does not have a pressure detector (54) for determining the end point. Instead, CVD device (100) directly measures the pressure in chamber (10) using pressure detector (52). As far as other features are concerned, the cleaning operation was performed in the same way as the cleaning operation in CVD device (1) of this invention, and the pressure in chamber (10) was directly monitored by pressure detector (52) to detect the end point of the cleaning operation.

As shown by line 76 in FIG. 3, it is difficult to determine the end point by controlling the pressure in the chamber according to Comparative Operation 2, since the rise in pressure is immediately corrected. On the other hand, according to the present invention the pressure is monitored by pressure manometer (54) arranged on downstream side (48b) with respect to the throttle valve on the exhaust line to determine the end point. Even though the pressure in the chamber is controlled, the variation in the exhaust line pressure can be detected at a high sensitivity. Consequently, it is possible to correctly detect the end point.

The present invention is not limited to the specific embodiment of Example 1. Various modifications can be made. For example, the cleaning gases are not limited to $NF_3$, but may be any suitable cleaning gas, such as halogen-containing gases. The most preferred cleaning gases include fluorine-containing gases, such as $NF_3$, $CF_4$, $SF_6$, $CHF_3$, $C_2F_6$, $C_3F_8$ or mixtures thereof As explained in detail above, the CVD device and method of this invention include a first pressure detector, which is connected to the exhaust line downstream of the adjustable throttle valve. With this first pressure detector, it is possible to correctly detect the endpoint of a cleaning operation even though the chamber pressure is controlled. As a result, the present invention provides a stable plasma and more accurately determines the end point of the cleaning operation. Consequently, in practical semiconductor manufacturing operations, the present invention makes it possible to minimize the time lag between completion of the cleaning operation and the beginning of a subsequent deposition process, and a higher chamber productivity can be realized.

While the foregoing is directed to the preferred embodiment of the present invention, other and further embodiments of the invention may be devised without departing from the basic scope thereof, and the scope thereof is determined by the claims which follow.

What is claimed is:

1. A method of cleaning deposits in a chemical vapor deposition chamber, the method comprising the steps of:

(a) supplying a cleaning gas to the chamber;

(b) forming a plasma within the chamber;

(c) reacting the cleaning gas with deposits within the chamber until the deposits are consumed;

(d) exhausting gases from the chamber through an exhaust line communicating with an exhaust means;

(e) controlling an adjustable valve in the exhaust line to maintain a setpoint pressure within the chamber;

(f) detecting the pressure in the exhaust line between the adjustable valve and the exhaust means; and (g) determining the end point of the reaction according to a change in the exhaust line pressure.

2. The method of claim 1, wherein the pressure is detected nearer the exhaust means than the adjustable valve.

3. The method of claim 1, further comprising a second pressure detector connected to the chamber for measuring the inhale pressure of the chamber, wherein the second pressure detector communicates the chamber pressure to the controller, and wherein the controller adjusts the adjustable valve to control the chamber pressure at the setpoint pressure.

4. The method of claim 1 further comprising the steps of:

(h) terminating plasma right after determining the end point of the cleaning gas reaction.

5. The method of claim 1, wherein the cleaning gas is a halogen-containing gas, and the end point is determined by a rise in the exhaust line pressure.

6. The method of claim 5, wherein the halogen-containing gas is a fluorine-containing gas.

* * * * *

UNITED STATES PATENT AND TRADEMARK OFFICE
CERTIFICATE OF CORRECTION

PATENT NO. : 6,192,898 B1
DATED : February 27, 2001
INVENTOR(S) : Aitani et al.

It is certified that error appears in the above-identified patent and that said Letters Patent is hereby corrected as shown below:

Column 6,
Line 27, please insert a -- . -- after "plasma".

Column 7,
Line 25, please delete the "." after "by".

Column 8,
Line 7, please insert -- a -- after "setpoint".

Signed and Sealed this

Thirtieth Day of October, 2001

*Attest:*

NICHOLAS P. GODICI
*Attesting Officer*     *Acting Director of the United States Patent and Trademark Office*